United States Patent
Li (10) Patent No.: US 12,150,327 B2
(45) Date of Patent: Nov. 19, 2024

(54) ORGANIC LIGHT-EMITTING DISPLAY DEVICE, MANUFACTURING METHOD THEREOF, AND DISPLAY PANEL

(71) Applicant: Wuhan China Star Optoelectronics Semiconductor Display Technology Co., Ltd., Wuhan (CN)

(72) Inventor: Weiwei Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 873 days.

(21) Appl. No.: 17/262,755

(22) PCT Filed: Sep. 10, 2020

(86) PCT No.: PCT/CN2020/114359
§ 371 (c)(1),
(2) Date: Jan. 25, 2021

(87) PCT Pub. No.: WO2022/007177
PCT Pub. Date: Jan. 13, 2022

(65) Prior Publication Data
US 2022/0393127 A1   Dec. 8, 2022

(30) Foreign Application Priority Data

Jul. 6, 2020   (CN) .......................... 202010639512.8

(51) Int. Cl.
*H10K 50/13*   (2023.01)
*H10K 50/11*   (2023.01)
(Continued)

(52) U.S. Cl.
CPC ............. *H10K 50/13* (2023.02); *H10K 50/11* (2023.02); *H10K 71/00* (2023.02); *H10K 59/12* (2023.02);
(Continued)

(58) Field of Classification Search
CPC ......... H10K 2101/90; H10K 50/00–88; H10K 59/00–95; H10K 50/13; H10K 50/131
See application file for complete search history.

(56) References Cited

U.S. PATENT DOCUMENTS

2008/0157657 A1   7/2008   Matsunami et al.
2010/0301382 A1*  12/2010  Shitagaki ............. H10K 50/155
                                                         257/E51.018
(Continued)

FOREIGN PATENT DOCUMENTS

CN   105895821 A   8/2016
CN   106159101 A   11/2016
(Continued)

*Primary Examiner* — Eric A. Ward
*Assistant Examiner* — Nora T. Nix
(74) *Attorney, Agent, or Firm* — Nathan & Associates; Menachem Nathan (57) ABSTRACT

An organic light-emitting diode display device is provided by the present application, including an anode layer, a cathode layer, and a light-emitting layer disposed between the anode layer and the cathode layer, wherein the light-emitting layer includes a first light-emitting layer and a second light-emitting layer stacked. The first light-emitting layer includes a first color light-emitting part, a second color light-emitting part, and a third color light-emitting part arranged in a same layer. The second light-emitting layer is configured to emit light of a first color, and the second light-emitting layer is disposed at a side of the first light-emitting layer and covers the first light-emitting layer.

13 Claims, 4 Drawing Sheets

(51) Int. Cl.
*H10K 71/00* (2023.01)
*H10K 59/12* (2023.01)
*H10K 101/40* (2023.01)

(52) U.S. Cl.
CPC ..... *H10K 59/1201* (2023.02); *H10K 2101/40* (2023.02)

(56) References Cited

U.S. PATENT DOCUMENTS

| | | | |
|---|---|---|---|
| 2016/0365527 A1* | 12/2016 | Gao | H10K 50/11 |
| 2018/0062103 A1 | 3/2018 | Kim et al. | |
| 2018/0226602 A1 | 8/2018 | Wu et al. | |
| 2018/0358585 A1 | 12/2018 | Yoneda et al. | |
| 2018/0375047 A1 | 12/2018 | You et al. | |
| 2021/0043866 A1* | 2/2021 | Kawamura | H10K 59/35 |
| 2022/0190272 A1* | 6/2022 | Sun | H10K 50/13 |

FOREIGN PATENT DOCUMENTS

| | | |
|---|---|---|
| CN | 107833975 A | 3/2018 |
| CN | 110335884 A | 10/2019 |
| CN | 111092163 A | 5/2020 |
| CN | 111165074 A | 5/2020 |
| WO | 2017099160 A1 | 6/2017 |

\* cited by examiner

ORGANIC LIGHT-EMITTING DISPLAY DEVICE, MANUFACTURING METHOD THEREOF, AND DISPLAY PANEL

BACKGROUND OF INVENTION

Field of Invention

The present application relates to the field of display, and particularly to an organic light-emitting display device, a manufacturing method thereof, and a display panel.

Description of Prior Art

Currently, organic light-emitting diode (OLED) display devices used in vehicles mainly include structures wherein red, green, and blue pixels are arranged side-by-side (RGB Side by Side, RGB-SBS) and tandem structures. OLED display devices using the RGB-SBS structure cannot achieve the current output efficiency and lifespan of devices using the tandem structure. However, as it is necessary to double a number of evaporation chambers in manufacturing a tandem structure compared to manufacturing a SBS structure, this increases complexity and production costs of mass production, and thus is inconducive to mass production.

SUMMARY OF INVENTION

In view of this, the present application aims to provide an organic light-emitting diode display device and a display panel which can improve current efficiency and lifespan, and can be easily manufactured with a low cost.

An organic light-emitting diode display device is provided by the present application, including an anode layer, a cathode layer, and a light-emitting layer disposed between the anode layer and the cathode layer, wherein the light-emitting layer includes a first light-emitting layer and a second light-emitting layer stacked; the first light-emitting layer includes a first color light-emitting part, a second color light-emitting part, and a third color light-emitting part arranged in a same layer; the second light-emitting layer is configured to emit light of a first color; and the second light-emitting layer is disposed at a side of the first light-emitting layer and covers the first light-emitting layer.

In one embodiment, the first color light-emitting part includes a first host material and a first guest material, the second color light-emitting part includes a second host material, the third color light-emitting part includes a third host material, and the second light-emitting layer includes a fourth host material and a fourth guest material.

In one embodiment, a first triplet excited state energy level of the fourth host material is higher than a first triplet excited state energy level of the second host material and a first triplet excited state energy level of the third host material.

In one embodiment, the second light-emitting layer is disposed between the cathode and the first light-emitting layer, and a highest occupied molecular orbital energy level of the fourth host material is lower than a highest occupied molecular orbital energy level of the first host material.

In one embodiment, the fourth host material includes an electron-transmission type light-emitting material, and the first host material includes a hole-transmission type light-emitting material.

In one embodiment, the second light-emitting layer is disposed between the anode and the first light-emitting layer, and a highest occupied molecular orbital energy level of the fourth host material is higher than a highest occupied molecular orbital energy level of the first host material.

In one embodiment, the fourth host material includes a hole-transmission type light-emitting material, and the first host material includes an electron-transmission type light-emitting material.

In one embodiment, a doping concentration of the first guest material in the first color light-emitting part is higher than a doping concentration of the fourth guest material in the second light-emitting layer.

In one embodiment, a doping concentration of the first guest material in the first color light-emitting part is higher than a doping concentration of the fourth guest material in the second light-emitting layer.

In one embodiment, a doping concentration of the first guest material in the first color light-emitting part is higher than a doping concentration of the fourth guest material in the second light-emitting layer.

A manufacturing method of an organic light-emitting diode display device is also provided, including steps of:

forming an anode layer;

forming a light-emitting layer on the anode layer, wherein the light-emitting layer includes a first light-emitting layer and a second light-emitting layer stacked; the first light-emitting layer includes a first color light-emitting part, a second color light-emitting part, and a third color light-emitting part arranged in a same layer; the second light-emitting layer is configured to emit light of a first color; the second light-emitting layer is disposed at a side of the first light-emitting layer and covers the first light-emitting layer; the first light-emitting layer is formed through an evaporation process with a fine mask; and the second light-emitting layer is formed through an evaporation process with a non-fine mask; and forming a cathode layer on the light-emitting layer to obtain the organic light-emitting diode display device.

A display panel is provided, including any one of above-mentioned the organic light-emitting diode display devices.

Compared to prior art, by adding a second light-emitting layer to the RGB-SBS structure according to the OLED devices of the present application, light emission of the light-emitting layer can be selectively compensated. In addition, by connecting two light-emitting layers in series, a number of light-emitting photons is increased, and light-emitting efficiency is improved, increasing lifespans of OLED devices under a same brightness. In addition, as the second light-emitting layer is configured to be planar in the OLED display devices of the present application, a fine mask process can be omitted, resulting in lower costs and improving yield. Furthermore, aperture ratio of the organic light-emitting diode display devices and display panels can also be improved.

BRIEF DESCRIPTION OF DRAWINGS

In order to more clearly illustrate the technical solution of the present application, a brief description of the drawings that are necessary for the illustration of the embodiments will be given as follows. Obviously, the drawings described below show only some embodiments of the present invention, and a person having ordinary skill in the art may also obtain other drawings based on the drawings described without making any creative effort.

DETAILED DESCRIPTION OF PREFERRED EMBODIMENTS

The present disclosure is further described in detail below with reference to the accompanying drawings and embodiments. Obviously, the following described embodiments are only part of the present disclosure but not all. A person having ordinary skill in the art may obtain other embodiments based on the embodiments provided in the present disclosure without making any creative effort, which all belong to the scope of the present disclosure.

Figure 1:
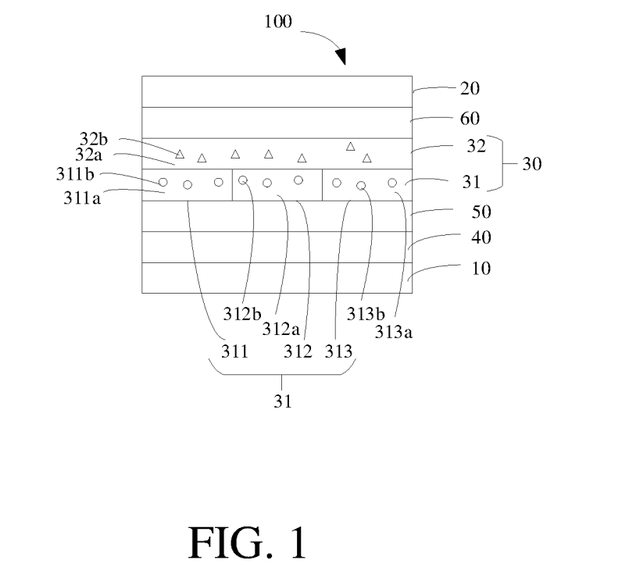
FIG. 1 is a structural schematic diagram of an organic light-emitting diode (OLED) display device provided by a first embodiment of the present application.

Please refer to FIG. 1, an organic light-emitting diode (OLED) display device 100 is provided by a first embodiment of the present application. There are no restrictions on type of the OLED display device 100. In one embodiment of the present application, the OLED display device 100 can be, for example, a quantum dot light emitting diode (QLED) display panel.

The OLED display device 100 includes an anode layer 10, a cathode layer 20, and a light-emitting layer 30 disposed between the anode layer 10 and the cathode layer 20. The light-emitting layer 30 includes a first light-emitting layer 31 and a second light-emitting layer 32 stacked.

According to light-emitting directions, the OLED display device 100 can be divided into top-emitting type and bottom-emitting type. According to the type of the OLED display device 100, the anode 10 can be a metal electrode layer or a transparent electrode layer. A material of the metal electrode layer can be selected from metal materials having high work function. A material of the transparent electrode layer can be selected from metal oxides, such as indium tin oxide, etc. The cathode 20 also can be the metal electrode layer, the transparent electrode layer or a semitransparent electrode layer. A material of the metal electrode layer can be selected from metal materials having low work function, such as lithium, calcium, magnesium, beryllium, aluminum, gold, silver, alloys of two or more metals, etc. A material of the transparent electrode layer and the semitransparent electrode layer can be selected from metal oxides, such as indium tin oxide, etc.

The first light-emitting layer 31 includes a first color light-emitting part 311, a second color light-emitting part 312, and a third color light-emitting part 313 arranged side-by-side, i.e., disposed in a same layer. The first color light-emitting part 311 is configured to emit light of a first color. The second light-emitting part 312 is configured to emit light of a second color. The third light-emitting part 313 is configured to emit light of a third color. Each of the first light-emitting part 311, the second light-emitting part 312, and the third light-emitting part 313 corresponds to one of a red light-emitting part, a blue light-emitting part, or a green light-emitting part respectively. For example, in this embodiment, the first color can be any one of red, blue, or green. It can be understood that in other embodiments of the present application, the first light-emitting layer 31 can further include light-emitting layers of a fourth color, and the fourth color can be yellow, or white. The first color can be any one of red, blue, green or yellow, or any one of red, blue, green, or white.

The first color light-emitting part 311 includes a first host material 311a and a first guest material 311b. The second color light-emitting part 312 includes a second host material 312a and a second guest material 312b. The third color light-emitting part 313 includes a third host material 313a and a third guest material 313b. A guest material is doped in a host material. A doping concentration of the guest material is controlled by different evaporation rates in a double source co-evaporation technology. The so-called doping concentration refers to a ratio of a thickness of the guest material to a total thickness of the host material and the guest material during evaporation. In other words, equation for calculating the doping concentration is: Doping concentration=thickness of guest material/(thickness of host material+thickness of guest material)*100%.

The second light-emitting layer 32 is configured to emit light of a first color. In this embodiment, the second light-emitting layer 32 is disposed between the cathode 10 and the first light-emitting layer 31. The second light-emitting layer 32 includes a fourth host material 32a and a fourth guest material 32b. The higher the doping concentration is, the lower the electron mobility is. Therefore, in order to improve electron transfer from the second light emitting layer 32 to the first color light-emitting part 311, a doping concentration of the first guest material 311b in the first color light-emitting part 311 is greater than a doping concentration of the fourth guest material 32b in the second light emitting layer 32. Moreover, in one embodiment, the doping concentration of the first guest material 311b in the first color light-emitting part 311 is 3% to 5%, and the doping concentration of the fourth guest material 32b in the second light-emitting layer 32 is less than 3%.

A highest occupied molecular orbital (HOMO) energy level of the fourth host material 32a is less than a HOMO energy level of the first host material 311a. The fourth host material 32a includes an electron-transmission type light-emitting material, and the first host material 311a includes a hole-transmission type light-emitting material. In the present application, the so-called "hole-transmission type material" refers to materials whose hole mobility is greater than electron mobility, or whose hole injection capability is greater than electron injection capability. The so-called "electron-transmission type material" refers to materials whose electron mobility is greater than hole mobility, or whose electron injection capability is greater than hole injection capability. That is to say, hole transport is fast, and electron transport is slow in hole-transmission type materials; and hole transport is slow, and electron transport is fast in electron-transmission type materials. CBP can be listed as a hole-transmission type material. BAlq can be listed as an electron-transmission type material.

The second light-emitting layer 32 is located on a side of the first light-emitting layer 31, covers the first light-emitting layer 31, and is configured to be planar. That is to say, an orthographic projection of the second light-emitting layer 32 projected on the first light-emitting layer 31 covers the first light-emitting layer 31. The second light-emitting layer 32 configured to be planar can be manufactured with a non-fine mask, compared with the side-by-side RGB light-emitting layer manufactured with a fine mask, utilization of one fine mask can be omitted.

A first triplet excited state energy level of the fourth host material 32a is higher than a first triplet excited state energy level of the second host material 312a and a first triplet excited state energy level of the third host material 313a. Therefore, it can be ensured that light emission of the second color light-emitting part 312 will not be affected by the third color light-emitting part 313 of the second light-emitting layer 32.

In one embodiment, both the first color light-emitting part 311 and the second light-emitting layer 32 are blue light-emitting layers. Wherein, the fourth host material 32a of the second light-emitting layer 32 can be selected from compounds represented by formulas 1 and 2:

Wherein, R is hydrogen or a substituent having 1 to 20 carbon atoms and selected from a phenyl derivative, a biphenyl derivative, a naphthyl derivative, and an aryl derivative; and X is a monomer selected from a naphthyl derivative, a phenyl derivative, a phenylnaphthalene derivative, and a phenylanthracene derivative. The host material of the blue light may include at least one compound selected from anthracene dinaphthalene, anthracene dibiphenyl, anthracene naphthalene biphenyl, or anthracene diphenyl. Wherein, all of R1-R6 are a hydrogen atom, a halogen atom, a hydroxyl group, a cyano group, a nitro group, or a group including a carbonyl group with 20 or less carbon atoms, a group including a carbonyl ester group, an alkyl group, an alkenyl group, an alkoxyl group, a group including a silyl group with 30 or less carbon atoms, a group including an aryl group, a group including a heterocyclic group, and a group including an amino group or a derivative thereof.

In one embodiment, the fourth host material 32a of the second light-emitting layer 32 can be:

-continued

-continued

And the fourth guest material 32b can be a blue fluorescent dopant in prior art, there is no limitation in the present application.

Furthermore, the OLED display device 100 can further include a hole injection layer 40 and a hole transport layer 50 disposed between the anode layer 10 and the first light-emitting layer 31 and an electron transport layer 60 disposed between the cathode layer 20 and the first light-emitting layer 31.

Figure 2:
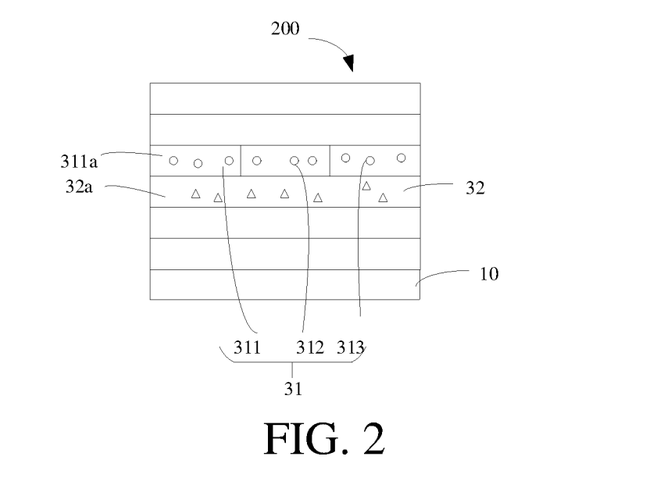
FIG. 2 is a structural schematic diagram of the OLED display device provided by a second embodiment of the present application.

Please refer to FIG. 2. An organic light-emitting diode display device 200 of a second embodiment of the present application is almost the same as the OLED display device 100 of the first embodiment, the difference being: the second light-emitting layer 32 is disposed between the anode 10 and the first light-emitting layer 31. The HOMO energy level of the fourth host material 32a is higher than the HOMO energy level of the first host material 311a. The fourth host material 32a includes a hole-transmission type light-emitting material, and the first host material 311a includes an electron-transmission type light-emitting material.

In one embodiment, both the first color light-emitting part 311 and the second light-emitting layer 32 are blue light-emitting layers. The fourth host material 32a can be selected from N,N'-Bis(1-naphthalenyl)-N,N'-bisphenyl-(1,1'-biphenyl)-4,4'-diamine (NPB), 4,4',4"-tris(N-carbazolyl)triphenylamine (TCTA), etc. The fourth guest material 32b, namely the blue fluorescent dopant, can be selected from 4,4'-bis(2,2'-diphenylvinyl)-1,1'-biphenyl (DPVBi), spiro-DPVBi, and spiro-6P, etc.

Please refer to FIG. 3 and FIG. 4(a)-FIG. 4(d). A manufacturing method of the OLED device is also provided by a fourth embodiment of the present application, which can be used to manufacture the OLED display device of the present application.

Figure 3:
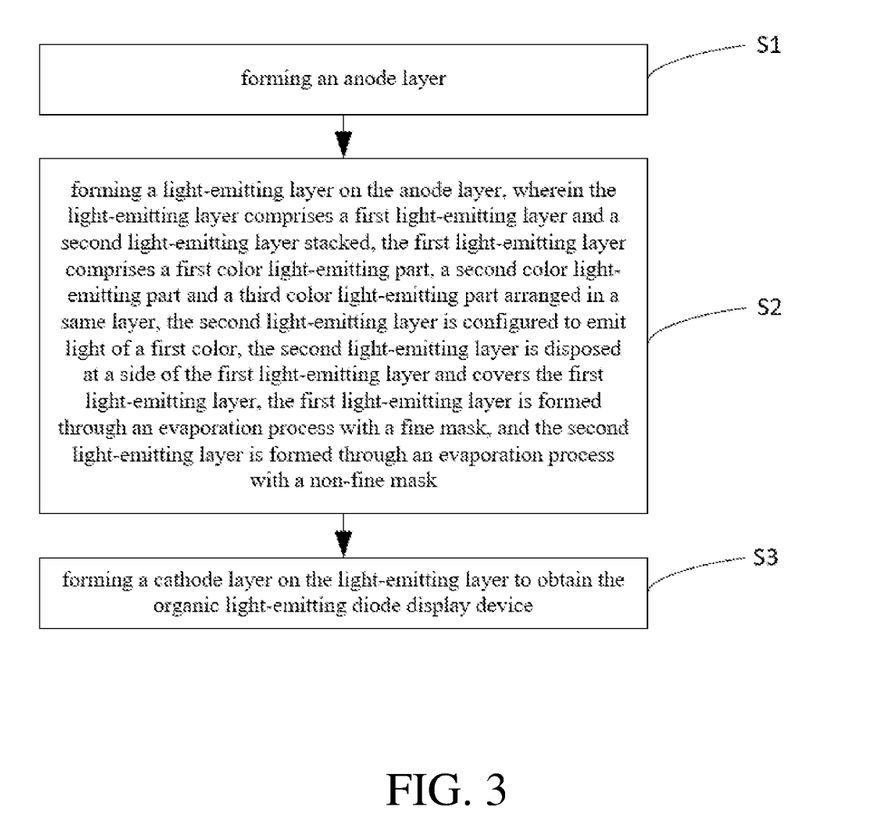
FIG. 3 is a flowchart of a manufacturing method of the OLED display device provided by a third embodiment of the present application.
Figure 4:
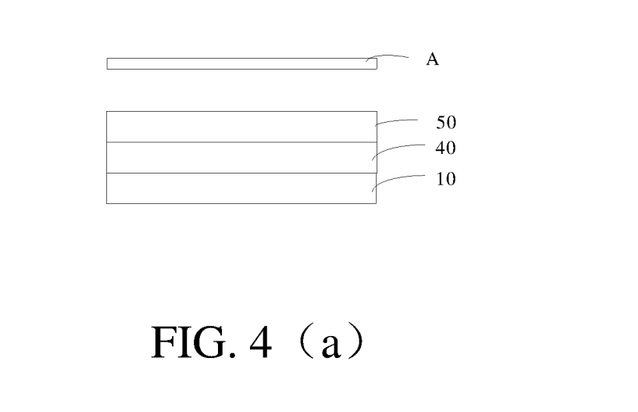
FIG. 4(a) to FIG. 4(d) are schematic diagrams of steps of the manufacturing method of the OLED device provided by a third embodiment of the present application.

The manufacturing method includes steps as follows:

S1: referring to FIG. 4(a), forming an anode layer 10. The anode layer 10 can be deposited on a substrate by vapor deposition.

S2: referring to FIG. 4(a) to FIG. 4(c), forming a light-emitting layer 30 on the anode layer 10. The light-emitting layer 30 includes a first light-emitting layer 31 and a second light-emitting layer 32 stacked. The first light-emitting layer 31 includes a first color light-emitting part 311, a second color light-emitting part 312, and a third color light-emitting part 313 disposed in a same layer. The second light-emitting layer 32 is configured to emit light of a first color, and is located on a side of the first light-emitting layer 31 and covers the first light-emitting layer 31. The second light-emitting layer 32 is configured to be planar. Wherein, the first light-emitting layer 31 is formed using a fine mask and the second light-emitting layer 32 is formed using a normal mask, which refers to a non-fine mask. In this embodiment, an evaporation using a fine mask A is used to form the first light-emitting layer 31, and an evaporation using a non-fine mask B is used to form a second light-emitting layer 32 on the first light-emitting layer 31.

In other embodiments, the first light-emitting layer 31 can be formed after the second light-emitting layer 32.

A step of forming a hole injection layer 40 and a hole transport layer 50 on the anode layer 10 can also be conducted between the step S1 and the step S2, and the light-emitting layer 30 is formed on the hole transport layer 50.

S3: referring to FIG. 4(d), forming a cathode layer 40 on the light-emitting layer 30 to obtain an OLED display device 100.

A step of forming an electron transport layer 60 on the light-emitting layer 30 can also be conducted between the step S2 and the step S3, and the cathode layer 40 is formed on the electron transport layer 60.

The cathode layer, the anode layer, the hole transport layer, the hole injection layer, and the electron transport layer can be manufactured by method of prior art. Detailed descriptions are omitted herein. In addition, please refer to the first embodiment and the second embodiment for other descriptions of the OLED devices, detailed descriptions are omitted herein.

Figure 5:
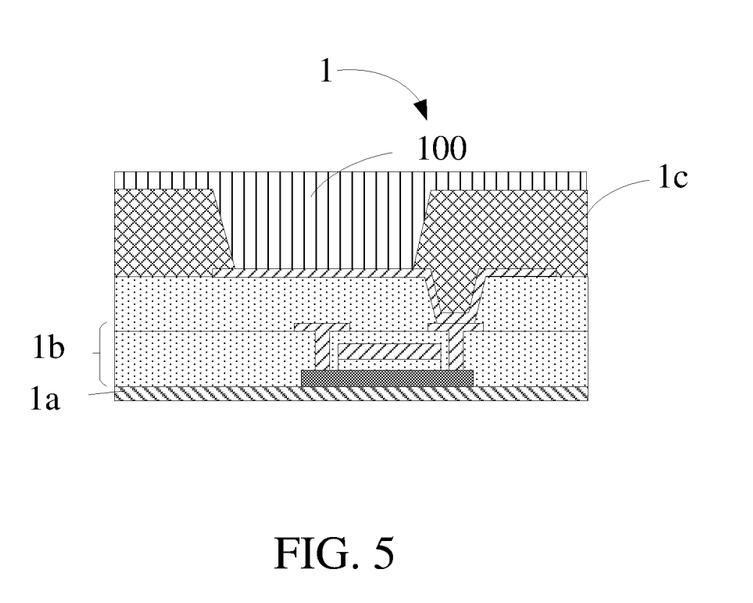
FIG. 5 is a structural schematic diagram of a display panel of a fourth embodiment of the present disclosure.

Referring to FIG. 5, a display panel 1 is also provided by the third embodiment of the present application. The display panel 1 can be used in mobile phones, tablet computers, televisions, billboards, ATMs, and car monitors, etc. In this embodiment, the display panel 1 is a car monitor. The display panel 1 includes a substrate 1a, a driver circuit layer 1b disposed on the substrate 1a, a pixel definition layer 1c and a plurality of organic light-emitting devices 100 disposed on the driver circuit layer 1b. The OLED device 100 is any one of the OLED devices provided by the present application.

Compared to prior art, by adding a second light-emitting layer to the RGB-SBS structure according to the OLED devices of the present application, light emission of the light-emitting layer can be selectively compensated. In addition, by connecting two light-emitting layers in series, a number of light-emitting photons is increased, and light-emitting efficiency is improved, increasing lifespans of OLED devices under a same brightness. In addition, as the second light-emitting layer is configured to be planar in the OLED display devices of the present application, a fine mask process can be omitted, resulting in lower costs and improving yield. Furthermore, aperture ratio of the organic light-emitting diode display devices and display panels can also be improved.

The above description provides a detailed introduction to the application. In this disclosure, specific examples are applied to explain principle and embodiments of the application. The description of the above embodiments is only used to help understand the application. At the same time, for those skilled in the art, according to the thought of the present disclosure, there will be changes in the specific embodiments and application scope. In conclusion, the content of the specification should not be understood as the limitation of the application.

What is claimed is:

1. An organic light-emitting diode display device, comprising an anode layer, a cathode layer, and a light-emitting layer disposed between the anode layer and the cathode layer, wherein the light-emitting layer comprises a first light-emitting layer and a second light-emitting layer stacked; the first light-emitting layer comprises a first color light-emitting part, a second color light-emitting part, and a third color light-emitting part arranged in a same layer; the second light-emitting layer is configured to emit light of a first color; and the second light-emitting layer is disposed at a side of the first light-emitting layer and covers the first light-emitting layer;

wherein the first color light-emitting part comprises a first host material, and the second light-emitting layer comprises a fourth host material; and the second light-emitting layer is disposed between the cathode and the first light-emitting layer, and a highest occupied molecular orbital energy level of the fourth host material is lower than a highest occupied molecular orbital energy level of the first host material; and both of the first color light-emitting part and the second light-emitting layer are blue light-emitting layers.

2. The organic light-emitting diode display device in claim 1, wherein the first color light-emitting part comprises a first guest material, the second color light-emitting part comprises a second host material, the third color light-emitting part comprises a third host material, and the second light-emitting layer comprises a fourth guest material.

3. The organic light-emitting diode display device in claim 2, wherein a first triplet excited state energy level of the fourth host material is higher than a first triplet excited state energy level of the second host material and a first triplet excited state energy level of the third host material.

4. The organic light-emitting diode display device in claim 2, wherein the fourth host material comprises an electron-transmission type light-emitting material, and the first host material comprises a hole-transmission type light-emitting material.

5. The organic light-emitting diode display device in claim 4, wherein a doping concentration of the first guest material in the first color light-emitting part is higher than a doping concentration of the fourth guest material in the second light-emitting layer.

6. The organic light-emitting diode display device as claimed in claim 2, wherein a doping concentration of the first guest material in the first color light-emitting part is higher than a doping concentration of the fourth guest material in the second light-emitting layer.

7. The organic light-emitting diode display device in claim 1, wherein the first color light-emitting part comprises a first guest material, and a doping concentration of the first guest material in the first color light-emitting part 311 is 3% to 5%; and the second light-emitting layer comprises a fourth guest material, and a doping concentration of the fourth guest material in the second light-emitting layer is less than 3%.

8. A manufacturing method of an organic light-emitting diode display device, comprising steps of:

forming an anode layer;

forming a light-emitting layer on the anode layer, wherein the light-emitting layer comprises a first light-emitting layer and a second light-emitting layer stacked;

the first light-emitting layer comprises a first color light-emitting part, a second color light-emitting part, and a third color light-emitting part arranged in a same layer; the second light-emitting layer is configured to emit light of a first color; the second light-emitting layer is disposed at a side of the first light-emitting layer and covers the first light-emitting layer; the first light-emitting layer is formed through an evaporation process with a fine mask; and the second light-emitting layer is formed through an evaporation process with a non-fine mask; and forming a cathode layer on the light-emitting layer to obtain the organic light-emitting diode display device;

wherein the first color light-emitting part comprises a first host material, and the second light-emitting layer comprises a fourth host material; and the second light-emitting layer is disposed between the cathode and the first light-emitting layer, and a highest occupied molecular orbital energy level of the fourth host material is lower than a highest occupied molecular orbital energy level of the first host material; and both of the first color light-emitting part and the second light-emitting layer are blue light-emitting layers.

9. A display panel, comprising an organic light-emitting diode display device, wherein the organic light-emitting diode display device comprises an anode layer, a cathode layer, and a light-emitting layer disposed between the anode layer and the cathode layer, wherein the light-emitting layer comprises a first light-emitting layer and a second light-emitting layer stacked; the first light-emitting layer comprises a first color light-emitting part, a second color light-emitting part, and a third color light-emitting part arranged in a same layer; the second light-emitting layer is configured to emit light of a first color; and the second light-emitting layer is disposed at a side of the first light-emitting layer and covers the first light-emitting layer;

wherein the first color light-emitting part comprises a first host material, and the second light-emitting layer comprises a fourth host material; and the second light-emitting layer is disposed between the cathode and the first light-emitting layer, and a highest occupied molecular orbital energy level of the fourth host material is lower than a highest occupied molecular orbital energy level of the first host material; and both of the first color light-emitting part and the second light-emitting layer are blue light-emitting layers.

10. The display panel in claim 9, wherein the first color light-emitting part comprises a first guest material, the second color light-emitting part comprises a second host material, the third color light-emitting part comprises a third host material, and the second light-emitting layer comprises a fourth guest material.

11. The display panel in claim 10, wherein a first triplet excited state energy level of the fourth host material is higher than a first triplet excited state energy level of the second host material and a first triplet excited state energy level of the third host material.

12. The display panel in claim 10, wherein the fourth host material comprises an electron-transmission type light-emitting material, and the first host material comprises a hole-transmission type light-emitting material.

13. The display panel in claim 9, wherein the first color light-emitting part comprises a first guest material, and a doping concentration of the first guest material in the first color light-emitting part 311 is 3% to 5%; and the second light-emitting layer comprises a fourth guest material, and a doping concentration of the fourth guest material in the second light-emitting layer is less than 3%.

* * * * *